(12) United States Patent
Knee

(10) Patent No.: US 9,002,918 B2
(45) Date of Patent: Apr. 7, 2015

(54) ADAPTIVE SIGNAL PROCESSING

(75) Inventor: Michael James Knee, Petersfield (GB)

(73) Assignee: Snell Limited, Reading, Berkshire (GB)

( * ) Notice: Subject to any disclaimer, the term of this patent is extended or adjusted under 35 U.S.C. 154(b) by 395 days.

(21) Appl. No.: 13/411,096

(22) Filed: Mar. 2, 2012

(65) Prior Publication Data

US 2012/0226728 A1 Sep. 6, 2012

(30) Foreign Application Priority Data

Mar. 4, 2011 (GB) .................................. 1103739.7

(51) Int. Cl.
*G06F 17/10* (2006.01)
*H03H 21/00* (2006.01)

(52) U.S. Cl.
CPC ................................ *H03H 21/0012* (2013.01)

(58) Field of Classification Search
None
See application file for complete search history.

(56) References Cited

U.S. PATENT DOCUMENTS

| | | | | |
|---|---|---|---|---|
| 5,058,047 A | * | 10/1991 | Chung | 708/322 |
| 2005/0123035 A1 | * | 6/2005 | Yamamoto et al. | 375/234 |
| 2011/0216807 A1 | * | 9/2011 | Christoph | 375/130 |
| 2012/0027066 A1 | * | 2/2012 | O'Keeffe | 375/224 |
| 2012/0226728 A1 | * | 9/2012 | Knee | 708/301 |
| 2012/0308029 A1 | * | 12/2012 | Christoph | 381/71.12 |
| 2013/0204568 A1 | * | 8/2013 | Kitaura et al. | 702/104 |

FOREIGN PATENT DOCUMENTS

| | | |
|---|---|---|
| EP | 0622778 | 11/1994 |
| EP | 1542415 | 6/2005 |
| GB | 2467773 | 8/2010 |

OTHER PUBLICATIONS

GB1103739.7 Search Report relating to claims 1-6 dated Jun. 21, 2011, 4 pages.
GB1103739.7 Search Report relating to claims 7-9 dated Nov. 14, 2011, 2 pages.
GB1103739.7 Search Report relating to claims 10-12 dated Nov. 14, 2011, 2 pages.

* cited by examiner

*Primary Examiner* — David H Malzahn
(74) *Attorney, Agent, or Firm* — Michael Best & Friedrich LLP

(57) ABSTRACT

An adaptive low pass filtering process with a filter delay $D_A$ is conducted in parallel with reference low pass filtering process with a filter delay $D_R$ which is greater than $D_A$. The error is measured between a delayed version of the adaptive process output and the reference process output. Filter parameters of the adaptive process are controlled to minimize the error.

17 Claims, 5 Drawing Sheets

ADAPTIVE SIGNAL PROCESSING

FIELD OF INVENTION

This invention concerns processing of signals in applications where it is important to achieve a low latency or pipeline delay through the process.

BACKGROUND OF THE INVENTION

In real-time sampled-signal processing such as digital filtering, each output sample depends typically on a number of input samples and, in the case of recursive processing such as infinite impulse response (IIR) filtering, additionally on past output samples. In most applications there will be a correspondence in time between input samples and output samples. For example, an event in the input signal that is preserved by the process would be considered to be contemporaneous with the corresponding event in the output signal. In many cases it is desirable that the process has access to input samples both in the past and in the future. However, since a causal system cannot in reality access future samples, the process has to wait until the last required input sample has arrived before it can produce its output. This waiting period is known as the latency or pipeline delay of the process.

The latency of a process is therefore defined as the number of sample periods of delay that elapses between an event at the input to the process and the corresponding event at the output. In general, this delay need not be an integer; for example, the delay of a filter whose output is the average of input signals across a sample-period delay will be 0.5 sample periods. Latency is related to but not in general identical to group delay; however, for a symmetric or linear-phase filter such as the example just given, latency and group delay are identical. In the description that follows, latency is usually expressed as a whole number and may also be thought of as the number of "future" samples that would have to be made available to the filter in order for there to be no delay between input and output events.

This invention relates to processes or filters which are linear (at least instantaneously). By linear is meant that a linear transformation applied to the original input of the process or filter will result in a new output which is related by the same linear transformation to the original output. So, for example, processes involving rank ordering, quantisation or envelope detection are not linear processes.

Let us illustrate the property of latency in the case of a linear sampled-signal filter.

Consider a sampled input signal f(t) where t takes integer values. Suppose we wish to perform a filtering operation on this signal where the output depends on surrounding input and output samples:

$$g(t)=G(f(t-n),f(t-n-1),\ldots f(t+m),g(t-k),g(t-k+1),\ldots,g(t-1))$$

where m, n and k are positive integers. In the case of a symmetric finite impulse response (FIR) filter, m=n and k=0 and there is a direct, unambiguous correspondence between g(t) and f(t). In the more general case, we assume that an input event at a sample labelled t would be manifest at the output at the sample labelled t.

The output of this filter at any moment thus depends on m+n+1 input samples, which are considered to extend from n sample periods in the "past" to m sample periods in the "future", and on k "past" output samples.

This filtering operation may be represented diagrammatically as shown in FIG. 1. In this example, n=4, m=3 and k=5.

Because the output of the filter at time t depends on input samples considered to be up to m sample periods later than time t, the output cannot actually be calculated until time t+m, as represented in FIG. 2, where the samples are aligned with a time axis. We say in this case that the filter has a latency, or pipeline delay, of m=3 sample periods.

When designing a filter, there are two conflicting requirements regarding latency. In many applications, it is desirable to have access to a large number of "future" input samples. For example, if the object is to smooth or low-pass filter the signal, then many input samples are required, and if constant group delay is required, the filter also needs to be symmetric, so about half the samples need to be "future" samples, giving rise to a high latency. However, in real-time processing it is also desirable to minimize the latency so that the filter responds quickly to events at the input.

It is the object of certain aspects of this invention to provide a method or apparatus for real-time signal processing with low latency that retains some or all of the performance advantages available from processes with higher latency.

SUMMARY OF THE INVENTION

The invention consists in one aspect in a method and apparatus for adaptive signal processing in which the parameters of the process are adapted in order to minimize a measure of the error between a delayed version of its output and that of a reference process.

The reference process can in one sense be regarded as a process which would produce the desired output, were it not for the constraint on latency. Thus, given a set of conditions with two different latency constraints, one optimisation procedure would produce both the adaptive and the reference process, corresponding respectively with the two latency constraints. The reference process can be understood in this way to correspond with the adaptive process.

The process of minimizing the error will usefully be smoothed over a time interval which is not less than the delay. Advantages will then for example be secured in applications where variations in the signal which lead to changes in the error occur over a timescale which is shorter than the time interval over which the process of minimizing the error is smoothed The invention consists in another aspect in apparatus for adaptive signal processing comprising: an input terminal for receiving an input signal; a reference filter connected to receive the input signal from the input terminal and configured to provide a reference filter output with a filter delay $D_R$; an adaptive filter connected to receive the input signal from the input terminal and configured to provide an adaptive filter output with a filter delay $D_A$ which is less than $D_R$; a delay unit for delaying the adaptive filter output by a delay corresponding to $D_R$-$D_A$; and an adaption unit configured to measure the error between the delayed adaptive filter output and the reference filter output and to adapt the adaptive filter in response to said measured error.

In one example, both the reference filter and the adaptive filter are low pass filters.

The invention consists in yet another aspect in a method of signal processing to transform an input signal to a processed signal, comprising the steps of conducting a reference process on an input signal; conducting in parallel an adaptive process on said input signal to form the processed signal, said process having controllable parameters; measuring an error between a delayed version of the adaptive process output and the reference process output; and adapting the adaptive process by controlling said parameters to reduce said error.

Suitably, the delay of the adaptive process output serves to bring the adaptive process output into time correspondence with the reference process output.

Preferably, the step of adapting the adaptive process serves to minimize said error over a time period not less than said delay.

Typically, both the reference process and the adaptive process are low pass processes.

BRIEF DESCRIPTION OF THE DRAWINGS

An example of the invention will now be described with reference to the drawings in which.

DETAILED DESCRIPTION OF THE INVENTION

Figure 1:
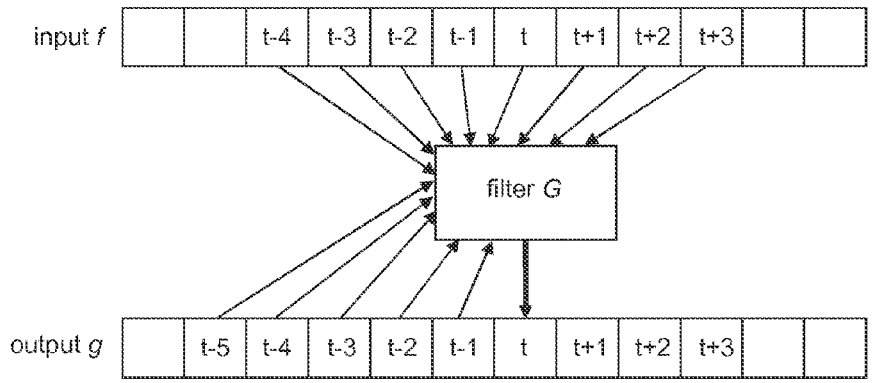
FIG. 1 is a diagram of a filter according to the prior art.
Figure 2:
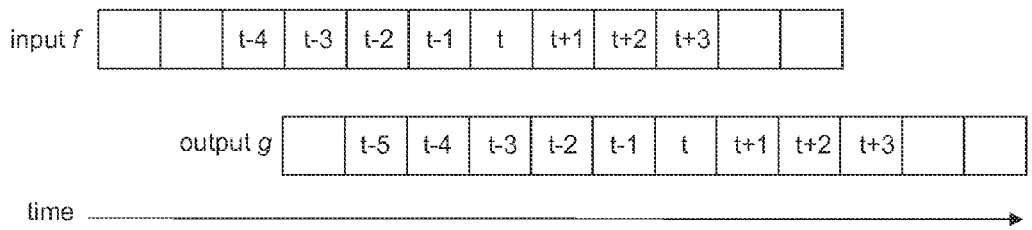
FIG. 2 illustrates the latency of a filter according to the prior art.
Figure 3:
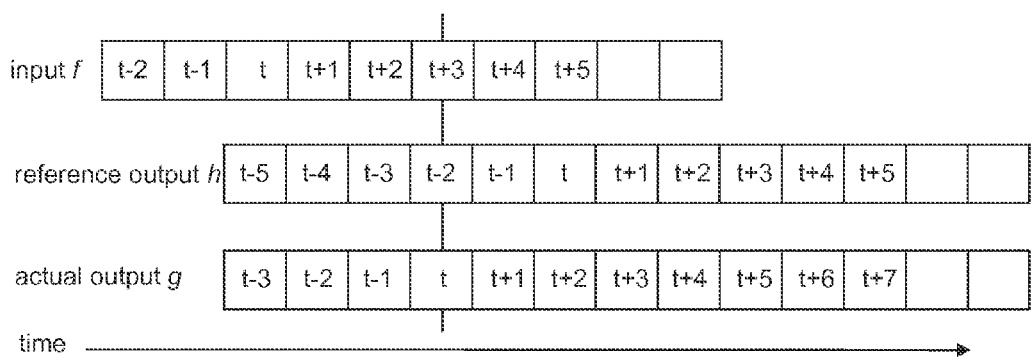
FIG. 3 illustrates the use of a reference filter according to the invention

In an adaptive filter according to the invention the coefficients of the filter are adapted in order to minimize a measure of the error between its output and that of a reference filter of higher latency. An illustration of the relative timings of the input signal, the reference filter output and the adaptive filter output is given in FIG. 3. In this example, the latency of the reference filter is 5 and the latency of the adaptive filter is 3. A block diagram of a suitable system is shown in FIG. 4.

The exemplary process operates on a sampled-signal filter; however the skilled person will appreciate that analogous processing can be carried out on filters operating on non-sampled analogue signals.

Figure 4:
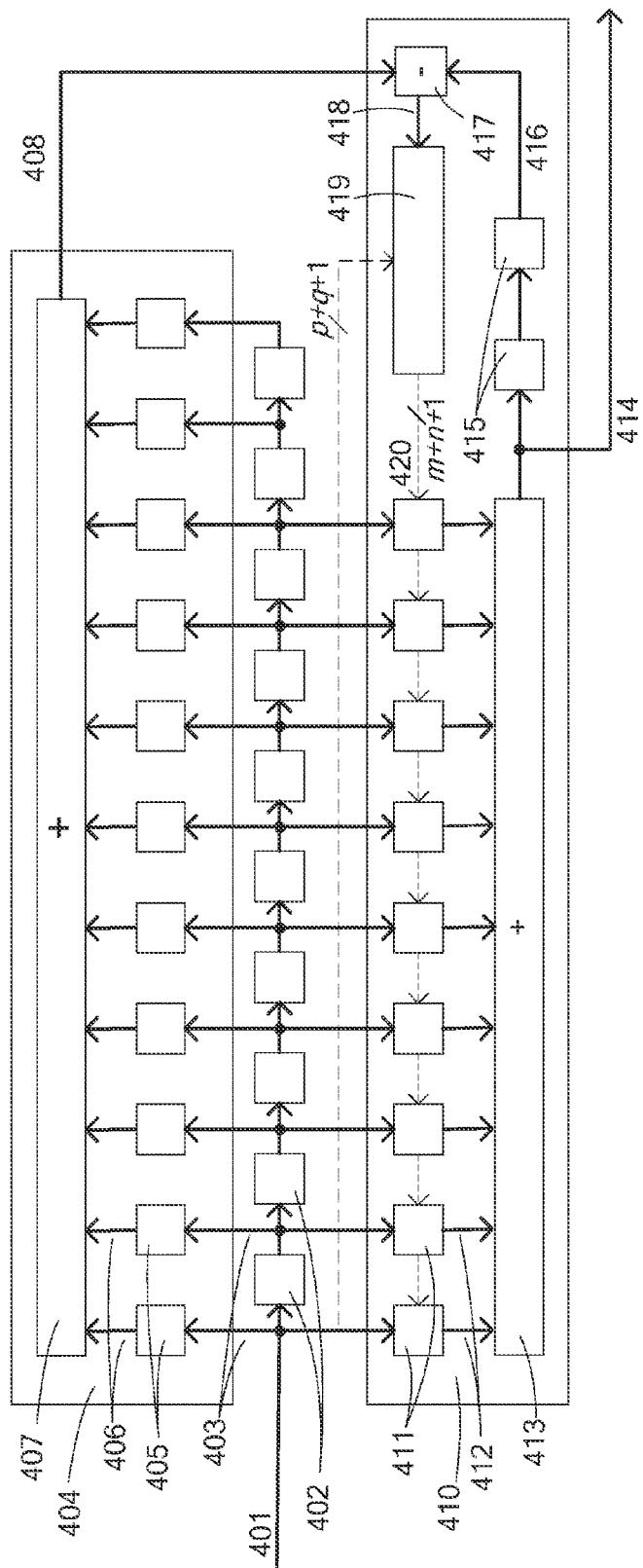
FIG. 4 is a block diagram of a filter according to the invention

Referring to FIG. 4, input data (401) is passed through a series of delay elements (402) whose outputs (403) are applied to a reference filter (404). The reference filter (404) consists of a set of coefficients (405) which are multiplied by the respective delayed input signals (403) to form partial sums (406) which are summed in an adder (407) to form the reference filter output (408).

The delayed input signals (403) are also applied to an adaptive filter (410). The adaptive filter (410) has a set of variable coefficients (411) which are multiplied by the respective delayed input signals (403) to form partial sums (412) which are summed in an adder (413) to form the adaptive filter output (414).

The adaptive filter output is also passed through a series of delay elements (415) providing a compensating delay equal to the difference in latency between the reference filter (404) and the adaptive filter (410). The output (416) of the compensating delay is subtracted from the output (408) of the reference filter in subtractor (417) to form an error signal (418) which is applied to an adaptation circuit (419). A further input to the adaptation circuit (419) consists of the outputs (403) of the delay elements (402). The output of the adaptation circuit consists of a set of adjustments (420) which are applied to the adaptive filter coefficients (411).

The detailed operation of an embodiment of the adaptation circuit (419) will now be described. Suitably, the LMS ("least mean squares") algorithm is employed, as described in Adaptive Signal Processing by Bernard Widrow and Samuel D. Stearns, Prentice Hall, 1985, ISBN 0-13-004029-0.

We have an input signal f(t) (401) which passes through an adaptive, instantaneously linear FIR filter G (410) with coefficients $w_i$ (411) to produce an output g(t) (414), as follows:

$$g(t) = \sum_{i=-m}^{n} w_i f(t-i)$$

where, in this exemplary embodiment, m=3 and n=5, so this filter has a latency of 3 according to the definition given above.

In the known LMS algorithm, we wish to choose coefficients that minimize the long-term error energy E between g(t) and a reference signal h(t):

$$E = \langle (g(t) - h(t))^2 \rangle = \left\langle \left( \sum_{i=-m}^{n} w_i f(t-i) - h(t) \right)^2 \right\rangle$$

The aim of the LMS algorithm is to adapt the coefficients by steepest descent.

Taking partial derivatives with respect to each of the coefficients, we have $$\frac{\partial E}{\partial w_i} = \left\langle 2f(t-i) \left( \sum_{i=-m}^{n} w_i f(t-i) - h(t) \right) \right\rangle$$

An unbiased estimate of this quantity is $$2f(t-i)e(t)$$

where $$e(t) = \sum_{i=-m}^{n} w_i f(t-i) - h(t) = g(t) - h(t).$$

This represents the steepest ascent of the partial derivative, so an iterative adaption by steepest descent leads to the following update formula:

$$w_i \rightarrow w_i - 2\mu f(t-i)e(t)$$

This is the classic LMS algorithm, but it is sensitive to the energy of the input f, so in practice a normalized LMS algorithm is used:

$$w_i \rightarrow w_i - \frac{\mu f(t-i)e(t)}{\sum_{i=-m}^{n} f(t-i)^2}$$

for which the optimum value of $\mu$ is 1.

We may wish to constrain the DC gain of the filter to be a constant value. If we were solving our optimization problem by Lagrange multipliers, we would add a constraint $\Sigma w_i = \alpha$ which has the effect of modifying the partial derivatives with a constant value $\lambda$ say. As we wish to maintain the constraint after each iteration, the modification to the original update equation is to add a constant to all the updates such that the gain is maintained:

$$w_i \rightarrow w_i - 2\mu f(t-i)e(t) + \frac{2\mu e(t)}{m+n+1} \sum_{j=-m}^{n} f(t-j)$$

According to the prior art, the reference signal h(t) could be the output (408) of the reference filter H (404) which has coefficients $r_i$ (405) acting on input signal f(t) as follows:

$$h(t) = \sum_{i=-p}^{q} r_i f(t-i)$$

where in this embodiment p=5 and q=5, so the reference filter H has a latency of p=5.

However, a direct attempt to minimize the error between g(t) and h(t) will tend to lead to a filter G with a latency equal to that of H, which in this example is 5 sample periods. The invention seeks to reduce the latency of G by delaying its output before comparison with the output of H. In this example we desire G to have a latency of 3, so we delay its output by 2 sample periods prior to forming the error signal. The LMS algorithm will then be used to minimize the error between h(t) and the output g'(t) of a modified filter G', defined by $$g'(t) = \sum_{i=-m'}^{n'} w'_i f(t-i)$$

where, in this example $$w'_i = w_{i+2}$$

$$m' = m - 2 = 1$$

$$n' = m + 2 = 7$$

Figure 5:
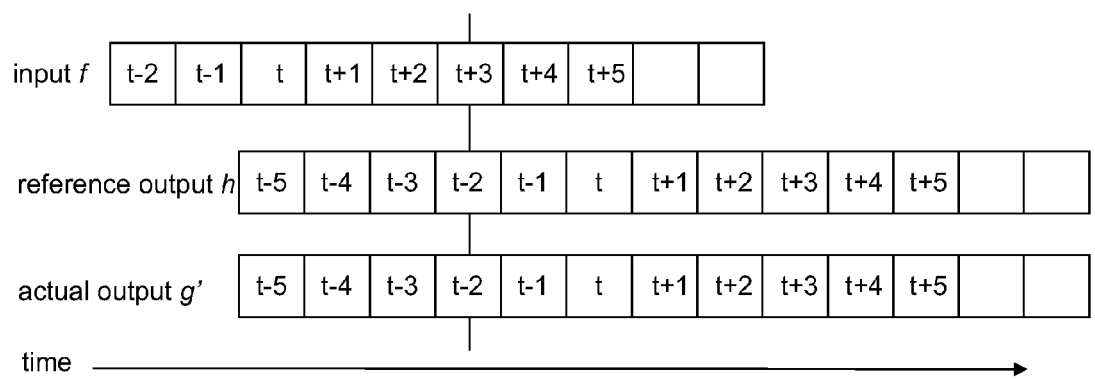
FIG. 5 illustrates the use of a delayed filter output according to the invention

This filter G' appears to have a latency of 1, but the action of the LMS algorithm will tend to give the filter G' an effective latency of 5, the same as that of the reference filter. The filter G at its output g(t) (414) will then have a latency of 3. The invention has therefore realised a filter with a latency of 3 whose output has been adapted to be as close as possible to the reference filter of latency 5. The use of the filter G' is illustrated in FIG. 5, as a comparison with FIG. 3.

Examples of the performance of the invention will now be given.

Figure 6:
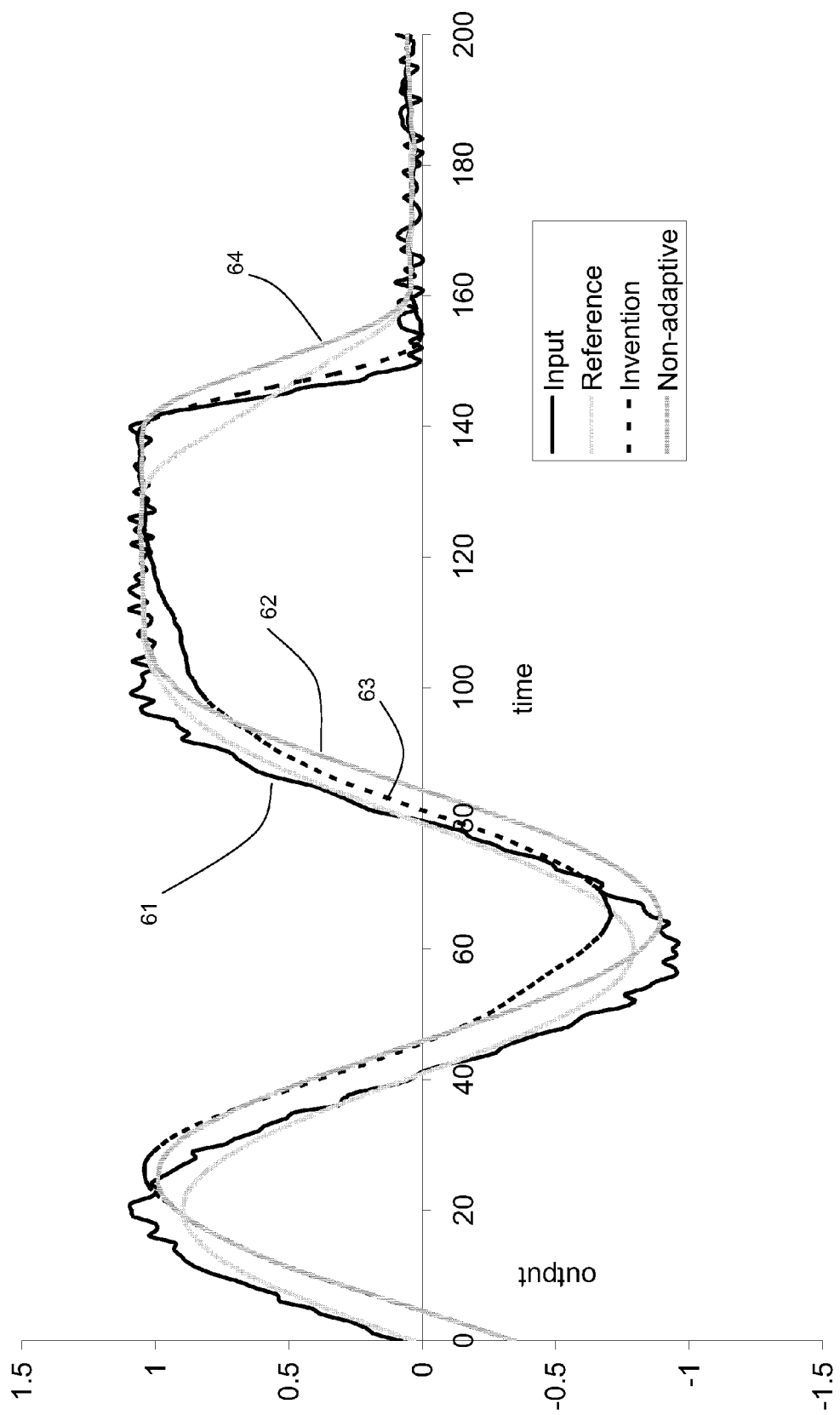
FIG. 6 is a graph illustrating the performance of the invention on a synthetic data set

FIG. 6 illustrates the performance of the invention on synthetic input data. The data consists of a low-frequency sinusoid followed by a sharper step function, with added noise. The reference smoothing filter is a 25-tap moving average, which is symmetrical so it has a latency of 12. The goal is to try to match the reference filter using a 15-tap filter with a latency of only 2. The graphs in FIG. 6 compare several signals: the unfiltered input (61), the output of the 25-tap smoothing filter (62), the output of an adaptive 15-tap latency-2 filter according to the invention (63), and the output of a non-adaptive 15-tap latency-2 fixed averaging filter (64) for comparison. The normalized version of the LMS algorithm is used.

To begin with, the output of the invention matches the non-adaptive filter to which it is initialized. After about 60 samples it has a much better match to the high-latency filter. It obviously cannot respond as quickly (with respect to output time) as the high-latency filter to the sharper transition after sample 140, but once it has responded it exhibits a much lower time lag than the non-adaptive filter. Overall, there is a 13% improvement in RMS error with respect to the non-adaptive filter.

Figure 7:
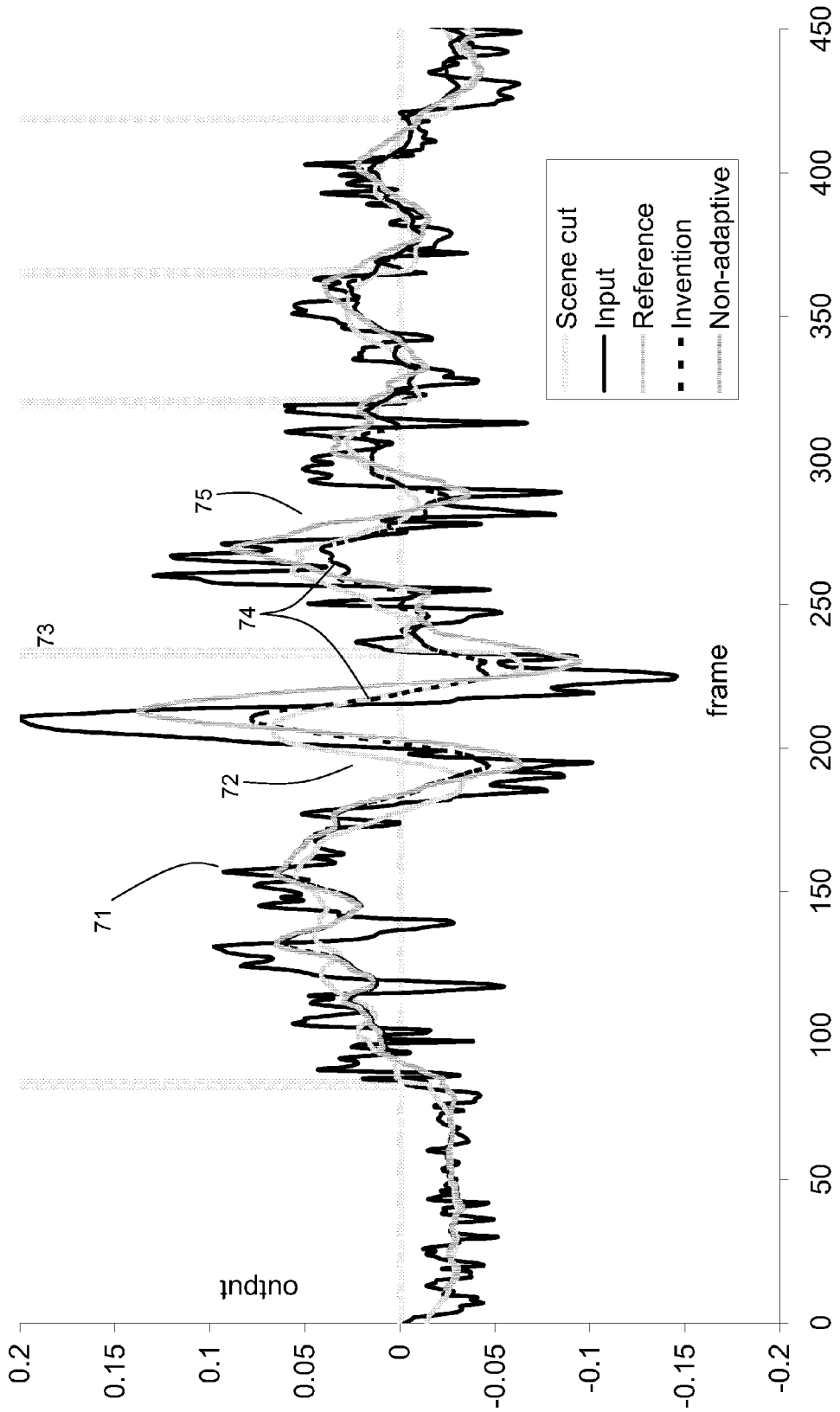
FIG. 7 is a graph illustrating the performance of the invention on a real data set

For the second example, illustrated in FIG. 7, the input data comes from the raw output of a "dynamic reframing" process which selects a small window from a video frame for display on a small device such as a mobile phone. The reframing process decides on a frame by frame basis where to centre the window (and what size it should be). In this example we take the horizontal window position for each frame as our input signal (71). This is typically a noisy signal which needs to be smoothed temporally to make the apparent movement of the window acceptable to the viewer. Again, the reference smoothing filter (72) is a 25-frame temporal average with latency 12, but with the additional feature that it does not filter across scene cuts (73). The output of this smoothing filter forms the reference signal which we would like to match using an adaptive filter with a latency of much less than 12 frames. For this example we use the same adaptive filter characteristics as in the first example, namely an overall filter length of 15 taps and a latency of 2. In order to exercise the invention as much as possible, we remove the specific scene cut adaptation from the adaptive filter so that the filter has to try to respond to scene cuts as part of its overall adaptation. The output of the adaptive filter is shown in FIG. 7 (74) together with the output of a non-adaptive low-latency filter (75).

The behaviour of the adaptive filter according to the invention can be summarised by saying that it performs comparable smoothing to the high-latency reference filter while being quicker to respond to transitions in the input data.

In the exemplary process first described, the higher latency reference filter is a fixed filter providing a desired output. We have seen in the above example that the reference filter can itself be adaptive—in this case to scene cuts. More generally, the reference filter could be any kind of adaptive filter, for example performing noise reduction on the input signal.

The exemplary process uses the LMS algorithm; however, the skilled person will appreciate that other adaptive algorithms can be used. Likewise, the exemplary process seeks to minimize an RMS error, but the skilled person will appreciate that other error measures can be used, for example mean absolute error.

Many important applications for the invention will lie in low pass filtering. However the invention extends to other filters and to other processes.

The input signals may take a variety of forms including analogue signals, sampled signals and digital signals and may include streamed signals and signals in the form of files. The signals will typically be electrical although optical forms of signals are included. The signals may in important examples represent images, video, audio or control signals relating thereto, such as a signal which describes the position or size of an adaptive window within a video frame.

The invention claimed is:

1. An apparatus for adaptive signal processing, the apparatus comprising:
   an input terminal for receiving an input signal;
   an output terminal;
   an adaptive filter connected to receive the input signal from the input terminal and configured to provide to said output terminal an adaptive filter output with a filter delay $D_A$;
   a reference filter corresponding to the adaptive filter, connected to receive the input signal from the input terminal and configured to provide a reference filter output with a filter delay $D_R$ which is greater than $D_A$;
   a delay unit for delaying the adaptive filter output by a delay corresponding to $D_R$-$D_A$;

and an adaption unit configured to measure the error between the delayed adaptive filter output and the reference filter output and to adapt the adaptive filter in response to the error, wherein the adaptive filter and the reference filter are each linear filters, at least instantaneously.

2. The apparatus according to claim 1 in which both the adaptive filter and the reference filter comprise low pass filters.

3. The apparatus according to claim 1 in which the error is a root mean square error.

4. The apparatus according to claim 1 in which the adaptation is performed using an LMS algorithm.

5. The apparatus according to claim 1 in which the reference filter comprises a fixed symmetric filter.

6. A method of signal processing to transform an input signal in a signal processor to a processed signal, the method comprising: conducting an adaptive process on an input signal to form the processed signal, said adaptive process having controllable parameters; conducting in parallel a corresponding reference process on said input signal; measuring an error between a delayed version of the adaptive process output and the reference process output; and adapting the adaptive process by controlling said parameters to reduce said error, wherein the adaptive process and the reference process are each linear, at least instantaneously.

7. The method according to claim 6, wherein the delay of the adaptive process output serves to bring the adaptive process output into time correspondence with the reference process output.

8. The method according to claim 6, wherein said step of adapting the adaptive process serves to minimize said error over a time period not less than said delay.

9. The method according to claim 6 in which the input signal is a sampled signal.

10. The method according to claim 6 in which the adaptive process is a filtering process.

11. The method according to claim 6 in which the input signal describes the position or size of an adaptive window within a video frame.

12. The method according to claim 6 in which the adaptive and the reference processes are the output of the same optimisation procedure operating on the same input conditions, save for respectively different latency constraints.

13. A method of low pass filtering an input signal, the method comprising:

conducting an adaptive low pass filtering process on an input, said process having controllable filter parameters and a filter delay $D_A$; conducting in parallel a reference low pass filtering process on said input signal, said reference process having a filter delay $D_R$ which is greater than $D_A$; measuring an error between a delayed version of the adaptive process output and the reference process output; and adapting the adaptive process by controlling said filter parameters to reduce said error.

14. The method according to claim 13 in which the error measure is a root mean square error and in which the adaptation is performed using an LMS algorithm.

15. The method according to claim 13 in which the reference process is a fixed filter.

16. The method according to claim 15 in which the fixed filter is symmetric.

17. The method according to claim 13 in which the input signal describes the position or size of an adaptive window within a video frame.

* * * * *